United States Patent [19]

LaVoie

[11] Patent Number: 4,774,475

[45] Date of Patent: Sep. 27, 1988

[54] LINEARIZED DIFFERENTIAL $F_T$ DOUBLER AMPLIFIER

[75] Inventor: Marvin E. LaVoie, Aloha, Oreg.

[73] Assignee: Tektronix, Inc., Beaverton, Oreg.

[21] Appl. No.: 129,499

[22] Filed: Dec. 7, 1987

[51] Int. Cl.$^4$ .............................................. H03F 1/32
[52] U.S. Cl. .................................... 330/149; 330/252
[58] Field of Search ..................... 330/149, 252, 311

[56] References Cited

U.S. PATENT DOCUMENTS 4,267,516  5/1981  Traa ................................ 330/252 X Primary Examiner—James B. Mullins
Attorney, Agent, or Firm—Peter J. Meza

[57] ABSTRACT

An improved differential $f_T$ doubler amplifier is provided having two error amplifiers in series connection with the main signal amplifier for cancelling the nonlinear currents generated by the main signal amplifier. The error amplifiers receive a differential error voltage provided by a pair of transistors which sense the error voltage in the main signal amplifier.

5 Claims, 1 Drawing Sheet

LINEARIZED DIFFERENTIAL $f_T$ DOUBLER AMPLIFIER

BACKGROUND OF THE INVENTION

The present invention relates to transistorized differential transconductance amplifiers, and more particularly to differential $f_T$ doubler amplifiers which are compensated in some manner to reduce nonlinear error currents.

U.S. Pat. No. 3,633,120 a differential transconductance amplifier which is now commonly known as an "$f_T$ doubler amplifier" or simply as an "$f_T$ doubler". The basis for this name comes from the operation of the amplifier. At high frequencies, the gain of a simple differential pair transconductance amplifier exhibits gain rolloff at approximately 6 dB per octave. The frequency at which the gain becomes unity is designated $f_T$ or the unity gain frequency. Due to the configuration of the $f_T$ doubler circuit, the same amount of voltage input will provide twice the amount of current output at the unity gain frequency. Also, because of the nature of the gain rolloff, the $f_T$ doubler circuit will provide the same amount of current output for a given input voltage as the simple differential pair transconductance amplifier at twice the unity gain frequency.

Although the $f_T$ doubler increases the frequency response beyond that of the simple differential pair transconductance amplifier, it retains the disadvantages of imprecise gain linearity. U.S. Pat. No. 4,267,516 teaches a differential $f_T$ doubler amplifier circuit having an error correction amplifier. This circuit retains the enhanced frequency response of the $f_T$ doubler, but has improved linearity. One axiom of using error correction amplifiers is that the error correction amplifier should not introduce any of its own error. Therefore, significant bias current must be used to linearize the error correction amplifier. This bias current, however, is not reused in the main amplifier and substantially increases the overall power requirements of the amplifier.

What is desired is a transconductance amplifier which retains the enhanced frequency response of the $f_T$ doubler amplifier, but has improved linearity without significantly increasing power requirements.

SUMMARY OF THE INVENTION

According to the present invention, an improved $f_T$ doubler amplifier is provided having two error amplifiers, each in series with the main amplifier, to compensate for nonlinearities due to large input voltages and thermally induced distortion. The present invention provides an improvement over prior error correction schemes in that the current used to bias the error amplifiers is completely reused to bias the main amplifier which results in a substantial savings in power.

In a preferred embodiment, an $f_T$ doubler amplifier has a pair of simple differential amplifiers having four emitter terminals and four corresponding bias current sources or bias resistors. Interposed between the four emitter terminals and the four bias current sources are two error amplifiers which produce an error current of opposite polarity to cancel the error current generated by the simple differential amplifiers. A pair of transistors senses the error voltage of the differential amplifiers which in turn controls the error amplifiers.

DESCRIPTION OF THE PREFERRED EMBODIMENT

Figure 1:
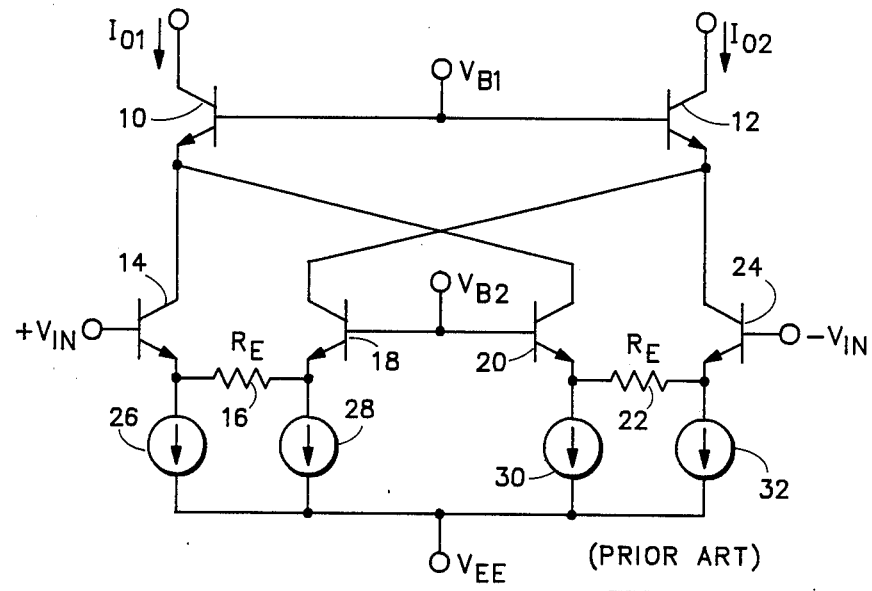
FIG. 1 is a schematic diagram of the prior art differential $f_T$ doubler amplifier.

Referring to FIG. 1, the prior art $f_T$ doubler amplifier includes a pair of differential amplifiers comprising transistors 14, 18, 20 and 24, and emitter resistors 16 and 22. The pair of differential amplifiers provide all the signal gain for the amplifier as well as an error current. The error current is due to a mismatch in the emitter base voltages. The bases of transistors 14 and 24 form the differential input for the amplifier, and the bases of transistors 18 and 20 are coupled to a reference voltage. Disregarding the effects of transistor beta, the voltages and currents of the differential amplifiers are balanced and may be described by:

$$V_{BE}(14)=V_{BE}(20) \text{ and } V_{BE}(18)=V_{BE}(24) \tag{1}$$

$$V_{BE}(14)-V_{BE}(18)=V_{BE}(20)-V_{BE}(24)=dV \tag{2}$$

$$I_E=(V_{IN}-dV)/R_E \tag{3}$$

The collectors of the two differential amplifiers are cross coupled to provide twice the current gain for the same voltage input. These currents are summed and flow through the common base stage comprised of transistors 10 and 12.

Figure 2:
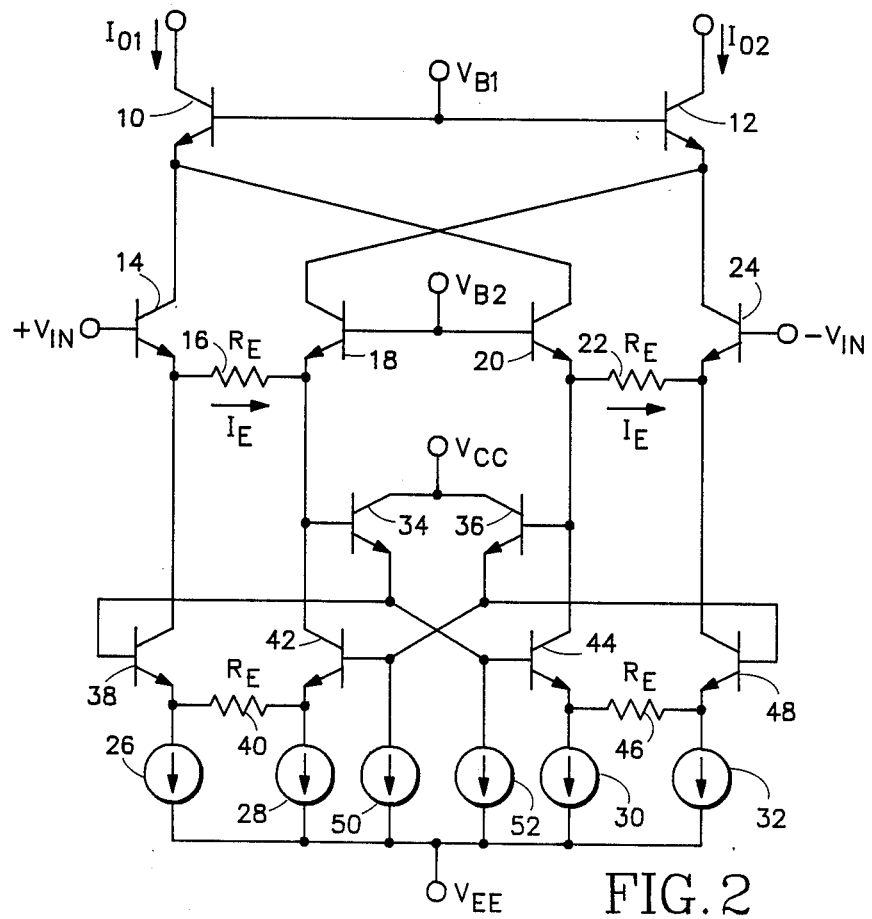
FIG. 2 is a schematic diagram a linearized differential $f_T$ doubler amplifier in accordance with the present invention.

Referring o FIG. 2, the amplifier according to the present invention produces an error current in a pair of error amplifiers which is necessary to correct the nonlinearities produced by the differential amplifiers. The amplifiers comprise transistors 38, 42, 44 and 48, emitter resistors 40 and 46, and current sources 26, 28, 30 and 32. The bias current sources 26, 28, 30 and 32 provide the bias current for transistors 38, 42, 44 and 48. This bias current also is used to bias transistors 14, 18, 20 and 24. The series connection of the error amplifiers permits the linearization of the amplifier with minimum additional power dissipation. The error amplifiers produce the same current output since the base of transistor 38 and the base of transistor 44, and the base of transistor 42 and the base of transistor 48 are coupled together.

The controlling voltage for the error amplifiers is provided by transistors 34 and 36, which comprise a differential buffer amplifier. The transistors are matched and biased by matched current sources 50 and 52. The base of transistor 34 is coupled to the emitter of transistor 18, and the base of transistor 36 is coupled to the emitter of transistor 20. The control voltage is the voltage between the emitters of transistors 34 and 36 and is given by:

$$V_{BE}(18)+V_{BE}(34)+V_{control}=V_{BE}(20)+V_{BE}(36) \tag{4}$$

Rearranging the terms and cancelling equal emitter voltages we have the following:

$$V_{control}=V_{BE}(20)-V_{BE}(18)=dV \tag{5}$$

The control voltage is then applied to the coupled bases of the two error amplifiers. The corresponding output currents produced by the collectors of the error amplifiers, assuming that emitter resistors 16, 22, 40 and 46 have substantially the same value, will have the same magnitude, but opposite polarity.

$$I_C(38) = I_C(44) = dV/R_E \quad (6)$$

$$I_C(42) = I_C(48) = -dV/R_E \quad (7)$$

It may now be shown that the collector current of the differential amplifiers are free of any error current.

$$\begin{aligned} I_C(14) &= I_C(20) = I_E + I_C(38) & (8) \\ &= (V_{IN} - dV)/R_E + dV/R_E & (9) \\ &= V_{IN}/R_E & (10) \\ I_C(18) &= I_C(24) = -I_E + I_C(42) & (11) \\ &= -(V_{IN} - dV)/R_E - dV/R_E & (12) \\ &= -V_{IN}/R_E & (13) \end{aligned}$$

The total differential output of the amplifier is given by:

$$\begin{aligned} I_{DIFF} &= I_{O1} - I_{O2} & (14) \\ &= I_C(14) + I_C(20) - (I_C(18) + I_C(24)) & (15) \\ &= 2*V_{IN}/R_E - -2*V_{IN}/R_E = 4*V_{IN}/R_E & (16) \end{aligned}$$

The total transconductance of the amplifier is:

$$G = (4*V_{IN}/R_E)/(2*V_{IN}) = 2/R_E \quad (17)$$

Note that the transconductance expression also has no error term but retains the advantage of the $f_T$ doubler circuit, namely a doubling of the current output for a given voltage input.

As in any integrated circuit, it is desirable to match certain devices in order that maximum performance may be obtained. Therefore it is desirable to match transistors 10 and 12; transistors 14, 18, 20 and 24; transistors 34 and 36, transistors 38, 42, 44, and 48; emitter resistors 16, 22, 40 and 46; current sources 26, 28, 30 and 32; and current sources 50 and 52.

While I have shown and described a preferred embodiment of my invention, it will be apparent to those skilled in the art that many changes and modifications may be made without departing from my invention in its broader aspects.

I claim:

1. A linearized transconductance amplifier for producing enhanced signal gain at high frequencies, said transconductance amplifier comprising:
   a. a differential $f_T$ doubler amplifier having first, second, third and fourth emitter terminals; and
   b. first and second error amplifiers each having a differential input and a differential output, the differential input of said first error amplifier being coupled to the differential input of said second error amplifier and to the second and third emitter terminals, the differential output of said first error amplifier being coupled to the first and second emitter terminals, the differential output of said second error amplifier being coupled to the third and fourth emitter terminals.

2. A linearized transconductance amplifier for producing enhanced signal gain at high frequencies, said transconductance amplifier comprising:
   a. a differential $f_T$ doubler amplifier having first, second, third and fourth emitter terminals;
   b. first and second error amplifiers each having a differential input and a differential output, the differential input of said first error amplifier being coupled to the differential input of said second error amplifier, the differential output of said first error amplifier being coupled to the first and second emitter terminals, the differential output of said second error amplifier being coupled to the third and fourth emitter terminals; and
   c. a differential buffer amplifier having a differential input and a differential output, the differential input being coupled to the second and third emitter terminals, the differential output being coupled to the coupled differential inputs of said first and second error amplifiers.

3. A transconductance amplifier as in claim 2 wherein said error amplifiers each comprise a pair of transistors having a base, collector and an emitter, the emitters being coupled through an emitter resistor, each of the emitters being coupled to a current source, the bases forming the differential input, and the collectors forming the differential output.

4. A transconductance amplifier as in claim 2 wherein said differential buffer amplifier comprises a pair of transistors having a base, collector and an emitter, the collectors being coupled together, the bases forming the differential input, and the emitters forming the differential output.

5. A transconductance amplifier as in claim 4 wherein said differential buffer amplifier further comprises a pair of current sources, one current source being coupled to each emitter.

* * * * *